(12) United States Patent
Boernert et al.

(10) Patent No.: US 10,359,489 B2
(45) Date of Patent: Jul. 23, 2019

(54) PHASE SENSITIVE INVERSION RECOVERY MRI WITH WATER/FAT SEPARATION

(71) Applicant: KONINKLIJKE PHILIPS N.V., Eindhoven (NL)

(72) Inventors: Peter Boernert, Eindhoven (NL); Jinnan Wang, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 209 days.

(21) Appl. No.: 15/104,280

(22) PCT Filed: Dec. 10, 2014

(86) PCT No.: PCT/IB2014/066746
§ 371 (c)(1),
(2) Date: Jun. 14, 2016

(87) PCT Pub. No.: WO2015/092619
PCT Pub. Date: Jun. 25, 2015

(65) Prior Publication Data
US 2016/0313422 A1    Oct. 27, 2016

Related U.S. Application Data

(60) Provisional application No. 61/917,976, filed on Dec. 19, 2013.

(51) Int. Cl.
*G01R 33/48* (2006.01)
*G01R 33/56* (2006.01)

(52) U.S. Cl.
CPC ..... *G01R 33/4828* (2013.01); *G01R 33/5602* (2013.01)

(58) Field of Classification Search
CPC .... G01R 33/20–586; A61B 5/05; A61B 5/055
See application file for complete search history.

(56) References Cited

U.S. PATENT DOCUMENTS 6,192,263 B1    2/2001  Ma
8,072,215 B2 *  12/2011 Fuderer .............. G01R 33/5615
                                                324/309
(Continued)

OTHER PUBLICATIONS

Wang et al, "References Acquisition of Phase-Sensitive Inversion" Proc. ISMRM 2013 p. 2077.
(Continued)

*Primary Examiner* — Huy Q Phan
*Assistant Examiner* — David B Frederiksen

(57) ABSTRACT

A phase sensitive inversion recovery (PSIR)-based MR imaging method of at least two chemical species having different MR spectra enables distinction between myocardial scar and myocardial triglyceride deposition. The method includes the steps of: a) generating echo signals at two or more different echo times by subjecting an object (10) positioned in the examination volume of a MR device (1) to an imaging sequence of RF pulses and switched magnetic field gradients, which imaging sequence is an inversion recovery sequence including an inversion RF pulse followed by an excitation RF pulse after an inversion recovery time; b) acquiring the echo signals; c) separating signal contributions of the at least two chemical species to the acquired echo signals; and d) reconstructing a phase-sensitive MR image (28, 29) from the signal contributions of at least one of the chemical species.

8 Claims, 2 Drawing Sheets

(56) References Cited

U.S. PATENT DOCUMENTS

| | | | |
|---|---|---|---|
| 9,575,154 B2* | 2/2017 | Simonetti | G01R 33/4828 |
| 2003/0060697 A1* | 3/2003 | Zhang | A61B 5/055 600/410 |
| 2005/0030025 A1 | 2/2005 | Ma et al. | |
| 2005/0165296 A1* | 7/2005 | Ma | G01R 33/4828 600/410 |
| 2008/0012566 A1* | 1/2008 | Pineda | G01R 33/5611 324/309 |
| 2008/0048659 A1* | 2/2008 | Reeder | G01R 33/4824 324/312 |
| 2010/0123460 A1* | 5/2010 | Hughes | A61B 5/055 324/309 |
| 2010/0195885 A1* | 8/2010 | Ma | G01R 33/4828 382/131 |
| 2011/0091090 A1* | 4/2011 | Dahlqvist Leinhard | G01R 33/4828 382/131 |
| 2011/0140696 A1* | 6/2011 | Yu | G01R 33/4828 324/309 |
| 2013/0194265 A1 | 8/2013 | Rehwald et al. | |
| 2013/0214783 A1* | 8/2013 | Zhao | G01R 33/4828 324/309 |
| 2014/0266192 A1* | 9/2014 | Taviani | G01R 33/4828 324/309 |
| 2014/0350386 A1 | 11/2014 | Eggers et al. | |

OTHER PUBLICATIONS

Kellman Peter el al: "Multiecho dixon fat and water separation method for detecting fibrofatty infiltration in the myocardium", Magnetic Res0nance in Medicine, J0hn Wiley & SDNS, Inc, United States, vol. 61, No. 1, Jan. 1, 2009 (Jan. 1, 2009), pp. 215-221.

Son J, Li J: "TI-Contrast Enhanced Single-Point Dixon With Integrated PSIR Based on Orthogonal Phase", Proceedings of the International Society for Magnetic Resonance in Medicine, 15th Annual Meeting and Exhibition, Berlin,Germany, May 19-25, 2007,vol. 15, May 5, 2007 (May 5, 2007), p. 1640.

Huanzhou Yu et al: "Field map estimation with a region growing scheme for iterative 3-point water-fat decomposition".Magnetic Resonance in Medicine, vol. 54, No. 4, Sep. 2, 2005 (Sep. 2, 2005), pp. 1032-1039.

Hongjun Tian et al: "A Modified Water Fat Separation Algorithm Based on Region Growing",Bioinformatics and Biomedical Engineering,2009.ICBBE 2009. 3rd International Conference on, IEEE, Piscataway, NJ, USA,Jun. 11, 2009 (Jun. 11, 2009), pp. 1-3.

Jinnan Wang et al: "Referenceless Acquisition of Phase-sensitive Inversion-recovery with Decisive reconstruction (RAPID) for Late Gadolinium Enhancement imaging",Proceedings of the International Society for Magnetic Resonance in Medicine, 21st Annual Meeting and Exhibition, Salt Lake City, Utah, USA, Apr. 20-26, 2013,vol. 21, Apr. 6, 2013 (Apr. 6, 2013), p. 1413.

Holger Eggers et al: "Dual-Echo Dixon Imaging with Flexible Choice of Echo Times", Magnetic Resonance in Medicine, 2010 Wiley-Liss, Inc, vol. 65, No. 1, Sep. 21, 2010 (Sep. 21, 2010), pp. 96-107.

Berglund et al "Three Point Dixon Method Enables Whole Body Water and Fat Imaging of Obese Subjects" Magnetic Resonance in Medicine 63 p. 1659-1668 (2010).

* cited by examiner

PHASE SENSITIVE INVERSION RECOVERY MRI WITH WATER/FAT SEPARATION

CROSS REFERENCE TO RELATED APPLICATIONS

This application is a U.S. national phase application of International Application No. PCT/IB2014/066746, filed on Dec. 10, 2014, which claims the benefit of U.S. provisional Application Ser. No. 61/917,976 filed on Dec. 19, 2013 and is incorporated herein by reference.

FIELD OF THE INVENTION

The invention relates to the field of magnetic resonance (MR) imaging. It concerns a method of MR imaging of an object placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each line is digitized by collecting a number of samples. A set of k-space data is converted to an MR image by means of Fourier transformation.

Inversion recovery (IR) is generally used as a magnetization preparation technique in MR imaging. In IR imaging, the longitudinal magnetization along the main magnetic field $B_0$ is first rotated to the negative z-direction using a 180° RF pulse. The inverted magnetization is then recovered by $T_1$ relaxation during an inversion recovery time (TI) between the inversion and an excitation RF pulse.

A known application of IR imaging is the so-called phase sensitive inversion recovery (PSIR) method which is particularly well suited for the detection and assessment of myocardial infarction. The main challenge in PSIR image reconstruction is a phase correction process to separate the intrinsic signal phase (determining the polarity of the signal) in the complex image from phase errors (referred to in the following as background phasing) which are common in an MR image. In particular, the background phasing includes effects due to off-resonance (spatial variation of the main magnetic field). In other words, phase sensitive reconstruction is used in PSIR to remove the background phasing while preserving the polarity of the desired signal.

Several approaches have been proposed for PSIR image reconstruction including calibration of the phase errors through acquisition of another image (reference image) without IR or with IR at different TIs. However, these approaches reduce data acquisition efficiency. Further, spatial misregistration between the actual and calibration scans due to patient motion can be problematic.

An alternative approach for PSIR image reconstruction is to determine the phase errors from the IR image itself using an appropriate phase correction algorithm. One such approach is the so-called reference-less acquisition of phase sensitive inversion recovery with decisive reconstruction (RAPID) method which is able to reliably restore the polarity of the magnetization without relying on a reference image (see Jinnan Wang et al., Proc. ISMRM 2013, 2077).

Myocardial triglyceride deposition is a common source of errors and misinterpretation in PSIR-based myocardial scar detection and quantification. In the phase sensitive reconstructed images, both myocardial scar and myocardial triglyceride deposition will result in hyper-intense signals which make them hardly distinguishable. The fat signal emanating from the myocardial triglyceride deposition cannot be easily suppressed using spectrally selective pulses (e.g. according to the known SPIR/SPAIR techniques) due to the natural, fast $T_1$ recovery at the optimal delay time (TI=200–250 ms).

SUMMARY OF THE INVENTION

From the foregoing it is readily appreciated that there is a need for an improved MR imaging technique. It is consequently an object of the invention to provide a PSIR-based MR imaging method which enables distinction between myocardial scar and myocardial triglyceride deposition.

In accordance with the invention, a method of MR imaging of at least two chemical species having different MR spectra is disclosed. The method of the invention comprises the steps of:

a) generating echo signals at two or more different echo times by subjecting an object positioned in the examination volume of a MR device to an imaging sequence of RF pulses and switched magnetic field gradients, which imaging sequence is an inversion recovery sequence comprising an inversion RF pulse followed by an excitation RF pulse after an inversion recovery time;

b) acquiring the echo signals;

c) separating signal contributions of the at least two chemical species to the acquired echo signals; and d) reconstructing a phase-sensitive MR image from the signal contributions of at least one of the chemical species.

The invention addresses the above described limitations of conventional PSIR-type MR techniques. The invention suggests integrating Dixon-type water/fat imaging with a phase-sensitive inversion recovery technique.

As known to those skilled in the field of MR imaging, it is often desired to obtain information about the relative contribution of different chemical species, such as water and fat, to the overall signal, either to suppress the contribution of some of them or to separately or jointly analyze the contribution of all of them. These contributions can be calculated if information from two or more corresponding echoes, acquired at different echo times, is combined. This may be considered as chemical shift encoding, in which an additional dimension, the chemical shift dimension, is defined and encoded by acquiring a couple of images at slightly different echo times. In particular for water-fat separation, these types of experiments are often referred to as Dixon-type of measurements. By means of Dixon imaging or Dixon water/fat imaging, a water/fat separation can be achieved by calculating contributions of water and fat from two or more corresponding echoes, acquired at different echo times. In general such a separation is possible because there is a known precessional frequency difference of hydrogen in fat and water. In its simplest form, water and fat images are generated by either addition or subtraction of the 'in phase' and 'out of phase' datasets. Many known Dixon water/fat separation algorithms provide not only a water image and a fat image, but also a map of $B_0$ field inhomogeneity, the so-called $B_0$ map.

The general concept of Dixon-type water/fat imaging is adopted according to the invention for phase sensitive fat and/or water MR image reconstruction by acquiring two or more echo images (i.e. one MR image attributed to each echo time) using inversion recovery. The approach of the invention enables separation of complex water and fat images, wherein a phase sensitive reconstruction of the water and/or fat images is performed. The reconstruction can be performed in a fully automated fashion such that no manual input is needed. The acquisition of an additional, e.g. fat-suppressed water reference image can be avoided.

In a preferred embodiment of the invention, the separation of the signal contributions involves a prediction of the phase evolution of the signal contributions of the at least two chemical species over the respective echo time according to the spatial variation of the main magnetic field $B_0$ and a corresponding demodulation of the acquired echo signals (in k-space or in image space). The phase evolution caused by the chemical shift may be separated from the phase evolution caused by the main magnetic field distribution based on the assumption that the latter varies smoothly over space, as it is common in many known Dixon-type applications.

It has to be noted that the term 'chemical species' has to be broadly interpreted in the context of the invention as any kind of chemical substance or any kind of nuclei having MR properties. In a simple example, the MR signals of two chemical species are acquired, wherein the chemical species are protons in the 'chemical compositions' water and fat. In a more sophisticated example, a multi-peak spectral model actually describes nuclei in a set of different chemical compositions which occur in known relative amounts.

In a preferred embodiment of the invention, the step of reconstructing the phase-sensitive MR image from the signal contributions of at least one of the chemical species involves (i) differentiation between polarity and background phasing and (ii) phase correction of the signal contributions of the respective chemical species according to the background phasing. These steps are used to determine the background phasing from the acquired echo signals (in image space or in k-space). The per se known RAPID method (see above), which uses a region growing technique for estimation of the background phasing, may be employed for this purpose. The RAPID algorithm is able to reliably restore the polarity of the magnetization without relying on a separately acquired reference image. A $B_0$ map derived from the echo signals using a Dixon algorithm (see above) may advantageously be used to predict the background phasing of the signal contributions of the respective chemical species in the step of reconstructing the phase-sensitive MR image. In other words, the $B_0$ map which is a result of the water/fat separation step is advantageously used in accordance with the invention to assist the phase sensitive reconstruction of the MR image.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
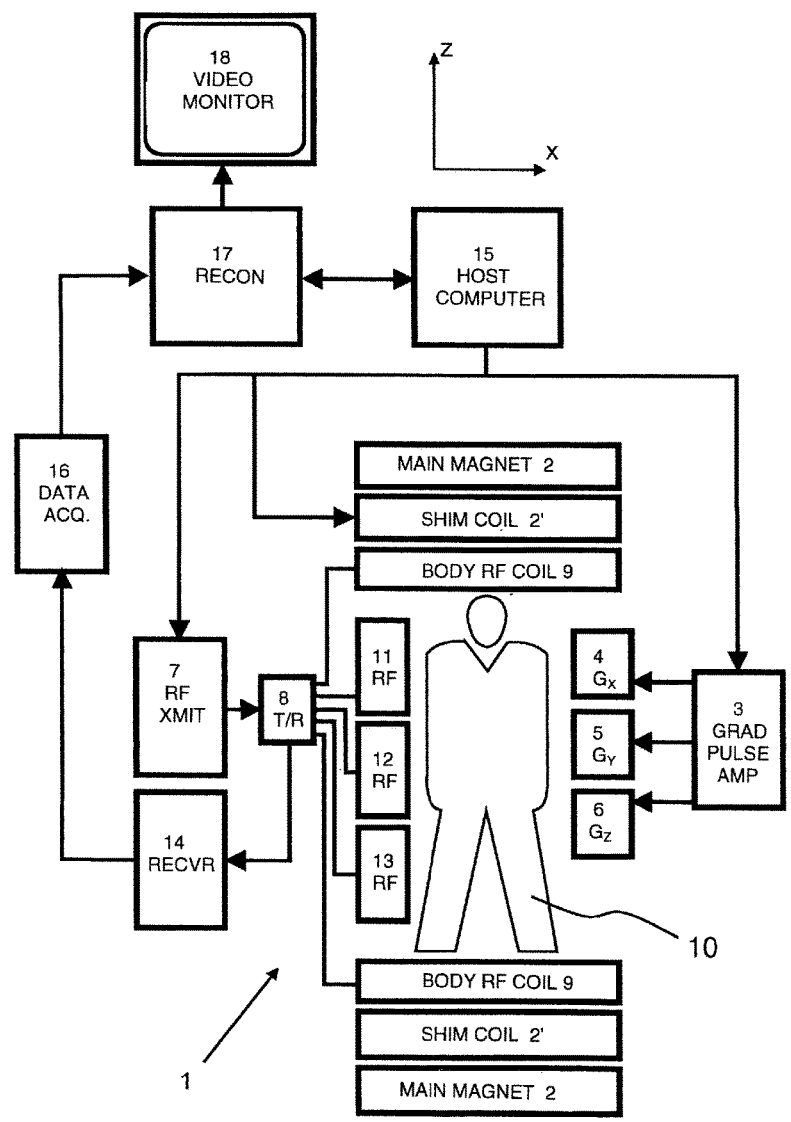
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the shimming coils 2' as well as the gradient pulse amplifier 3 and the transmitter 7 to generate an MR imaging sequence according to the invention. The receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

In an exemplary embodiment of the invention, an inversion recovery dual gradient echo sequence is used for the generation of first and second echo signals, wherein the echo time of the first echo (TE1) is 1.8 ms while the echo time (TE2) of the second echo is 3.1 ms. In a main magnetic field of 1.5 Tesla, the contributions of water and fat spins to the first echo signal are more out of phase, while they are more in phase at the time of the second echo signal. A plurality of first and second echo signals are generated and acquired with appropriate phase encoding in a common fashion in order to be able to reconstruct a complete MR image of the desired field of view. The imaging sequence comprises an initial inversion RF pulse followed by an excitation RF pulse. The initial inversion RF pulse (180°) rotates the longitudinal magnetization along the main magnetic field to the negative z-direction. The inverted magnetization is then recovered by $T_1$ relaxation during an inversion recovery time (TI) between the inversion and the excitation RF pulse. The echo signals are generated by appropriate gradient switching after the excitation RF pulse. The duration of TI may be in the range between 230-270 ms in a typical application for diagnosis and quantification of myocardial infarction.

Figure 2:
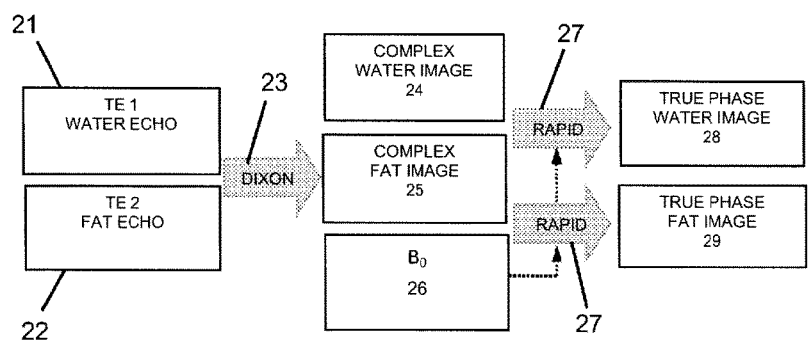
FIG. 2 shows a flow chart illustrating the method of the invention.

FIG. 2 schematically shows two single echo images 21, 22 reconstructed from the first and second echo signals at TE1 and TE2 respectively. A common 2-point Dixon algorithm 23 (such as described, e.g., by Eggers et al. in: Magnetic Resonance in Medicine, 65, 96-107, 2011) is employed to separate signal contributions of water and fat to the acquired echo signal data 21, 22 (in image space). As a result, a (complex) intermediate water image 24 and a (complex) intermediate fat image 25 are obtained. Additionally, the Dixon algorithm provides a map of $B_0$ field inhomogeneities, the $B_0$ map 26. In the next step, the above-mentioned RAPID algorithm 27 is employed for phase sensitive reconstruction of a water image 28 and a fat image 29 from the intermediate images 24 and 25 respectively. The $B_0$ map 26 derived from the echo signals 21, 22 is advantageously used to predict the background phasing of the signal contributions of water and fat in the reconstruction of the 'true phase' MR images 28, 29. In this way, the $B_0$ map 26 is used to assist the phase sensitive reconstruction 27.

The described technique can find application, e.g., in phase sensitive late gadolinium enhancement (LGE) for separating fat (triglyceride depositions) from myocardial scars in order to improve diagnostic confidence. It may also be used for other applications where both phase sensitive and robust water/fat separation is needed.

Figure 3:
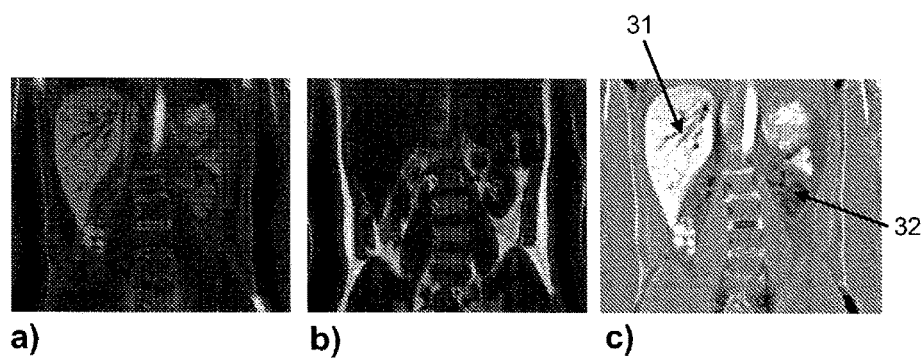
FIG. 3 shows MR images acquired according to the method of the invention.

FIG. 3 shows sample images, wherein the method of the invention is applied for a 2-point Dixon PSIR acquisition in body imaging (TI=500 ms). FIG. 3a is a water image and FIG. 3b is a fat image. The images of FIGS. 3a and 3b have been separated according to the invention. A phase sensitive water image as shown in FIG. 3c is reconstructed from the image of FIG. 3a without an additional phase reference scan. As can be seen in the phase sensitive water image of FIG. 3c, different organs present different signal polarities: The liver tissue (excluding vessels) 31 has a positive signal polarity while the kidney tissue 32 exhibits negative magnetization. A significantly increased image contrast is achieved in this way. The strongly different signal polarities are caused by the different values of $T_1$ of the respective organs. These are correctly identified by the algorithm of the invention.

The invention claimed is:

1. A method of magnetic resonance (MR) imaging of at least two chemical species having different MR spectra, the method comprising:
   a) generating echo signals at two or more different echo times by subjecting an object positioned in the examination volume of a MR device to an imaging sequence of radio frequency (RF) pulses and switched magnetic field gradients, which imaging sequence is an inversion recovery sequence comprising an inversion RF pulse followed by an excitation RF pulse after an inversion recovery time;
   b) acquiring the echo signals;
   c) apply a Dixon technique to reconstruct the echo signals into a complex first chemical species image which includes a dominant first chemical species component and a lesser second chemical species component, a complex second chemical species image which includes a dominant second chemical species component and a lesser first chemical species component, and a map of $B_0$ steady-state magnetic field inhomogeneities,
   d) background phase correct each voxel of the complex first chemical species image and the complex second chemical species image and determine a polarity of a phase of each voxel of the background phase corrected complex first chemical species and second chemical species images and reconstruct the phases and phase polarity of the complex first chemical species and second chemical species images into a true phase first chemical species image and a true phase second chemical species image.

2. The method of claim 1, wherein the separation of the signal contributions in step c) involves a prediction of the phase evolution of the signal contributions of the first and second chemical species over the respective echo time according to at least the spatial variation of the main magnetic field $B_0$.

3. The method of claim 2, wherein the prediction of the phase evolution of the signal contributions of the first and second chemical species over the respective echo time is used to demodulate the phase of these signal contributions.

4. The method of claim 1, wherein a region growing technique is used for estimation of the background phasing.

5. The method of claim 1, wherein the $B_0$ map is used to predict the background phasing of the signal contributions of the respective chemical species.

6. A magnetic resonance (MR) device for carrying out the method claimed of claim 1, wherein the MR device comprises:
   at least one main magnet coil for generating a uniform, steady magnetic field ($B_0$) within an examination volume,
   a number of gradient coils for generating switched magnetic field gradients in different spatial directions within the examination volume,
   at least one radio frequency (RF) coil for generating RF pulses within the examination volume and/or for receiving MR signals from an object positioned in the examination volume,
   a control unit for controlling the temporal succession of RF pulses and switched magnetic field gradients, and
   a reconstruction unit for reconstructing MR images from the received MR signals, wherein the MR device is configured to:
   a) generate a series of first echo signals at a first echo time and a series of second echo signals at a second echo time by subjecting an object positioned in the examination volume of a MR device to an imaging sequence of RF pulses and switched magnetic field gradients, which imaging sequence is an inversion recovery sequence comprising an inversion RF pulse followed by an excitation RF pulse after an inversion recovery time;
   b) acquire the echo signals;
   c) separate signal contributions of the at least two chemical species to the acquired echo signals; and
   d) reconstruct a first phase-sensitive MR image from the signal contributions of a first of the chemical species, a second phase sensitive MR image from signal contributions of a second of the chemical species, and a map of $B_0$ steady-state magnetic field inhomogeneities, wherein the first phase sensitive MR image includes a dominant first chemical species component and a lesser second chemical species component, and the second phase sensitive MR image includes a dominant second chemical species component and a first chemical species water component;
   e) background phase correct each voxel of the complex first chemical species image and the complex second chemical species image and determine a polarity of a phase of each voxel of the background phase corrected complex first chemical species and second chemical species images and reconstruct the phases and phase polarity of the complex first chemical species and second chemical species images into a true phase first chemical species image and a true phase second chemical species image.

7. A computer program to be run on a magnetic resonance (MR) device, which computer program comprises instructions stored on a non-transitory computer-readable medium for:
   a) generating a series of first echo signals at a first echo time and a series of second echo signals at a second echo time by means of an imaging sequence of radio frequency (RF) pulses and switched magnetic field gradients, which imaging sequence is an inversion recovery sequence comprising an inversion RF pulse followed by an excitation RF pulse after an inversion recovery time;
   b) acquiring the echo signals;
   c) apply a Dixon technique to reconstruct the echo signals into a complex water image which includes a dominant water component and a lesser fat component, a complex fat image which includes a dominant fat component and a lesser water component, and a map of $B_0$ steady-state magnetic field inhomogeneities,
   d) background phase correct each voxel of the complex water image and the complex fat image and determine a polarity of a phase of each voxel of the background phase corrected complex water and fat images and reconstruct the phases and phase polarity of the complex water and fat images into a true phase water image and a true phase fat image.

8. A magnetic resonance (MR) device comprising:
   at least one main magnet coil configured to generate a steady magnetic field ($B_0$) within an examination volume;
   a plurality of gradient coils configured to generate switched magnetic field gradients in a plurality of spatial directions within the examination volume;

at least one radio frequency (RF) coil configured to generate RF pulses within the examination volume and/or to receive MR signals from a subject disposed in the examination volume;

a control computer configured to:
  a) control the gradient coils and the at least one RF coil to generate a series of first echo signals at a first echo time and a series of second echo signals at a second echo time by subjecting the subject positioned in the examination volume of the MR device to an imaging sequence of RF pulses and switched magnetic field gradients, which imaging sequence is an inversion recovery sequence including an inversion RF pulse followed by an excitation RF pulse after an inversion recovery time,
  b) acquire the echo signals,
  c) apply a Dixon technique to reconstruct the echo signals into a complex water image which includes a dominant water component and a lesser fat component, a complex fat image which includes a dominant fat component and a lesser water component, and a map of Bo steady-state magnetic field inhomogeneities,
  d) background phase correct each voxel of the complex water image and the complex fat image and determine a polarity of a phase of each voxel of the background phase corrected complex water and fat images and reconstruct the phases and phase polarity of the complex water and fat images into a true phase water image and a true phase fat image.

* * * * *